(12) United States Patent
Watanabe

(10) Patent No.: US 10,601,379 B2
(45) Date of Patent: Mar. 24, 2020

(54) DIGITAL AMPLIFIER

(71) Applicant: Panasonic Intellectual Property Management Co., Ltd., Osaka (JP)

(72) Inventor: Shinichi Watanabe, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/026,116

(22) Filed: Jul. 3, 2018

(65) Prior Publication Data

US 2019/0028069 A1    Jan. 24, 2019

(30) Foreign Application Priority Data

Jul. 21, 2017    (JP) .................................. 2017-142242

(51) Int. Cl.
| | |
|---|---|
| *H03F 3/38* | (2006.01) |
| *H03F 1/32* | (2006.01) |
| *H03F 1/26* | (2006.01) |
| *H03M 1/12* | (2006.01) |
| *H03F 3/181* | (2006.01) |
| *H03F 3/217* | (2006.01) |
| *H03M 1/70* | (2006.01) |
| *H03M 1/82* | (2006.01) |

(52) U.S. Cl.
CPC ............. *H03F 1/3264* (2013.01); *H03F 1/26* (2013.01); *H03F 3/181* (2013.01); *H03F 3/217* (2013.01); *H03M 1/12* (2013.01); *H03F 2200/351* (2013.01); *H03M 1/70* (2013.01); *H03M 1/822* (2013.01)

(58) Field of Classification Search
CPC ........ H03F 1/3264; H03F 3/217; H03F 3/181; H03F 1/26; H03F 2200/351; H03M 1/12; H03M 1/70; H03M 1/822
USPC ........................ 330/10, 251, 207 A; 327/238
See application file for complete search history.

(56) References Cited

U.S. PATENT DOCUMENTS 6,768,779 B1    7/2004 Nielsen

FOREIGN PATENT DOCUMENTS

JP    3346581 B    11/2002

*Primary Examiner* — Khanh V Nguyen
*Assistant Examiner* — Khiem D Nguyen
(74) *Attorney, Agent, or Firm* — Greenblum & Bernstein, P.L.C.

(57) ABSTRACT

A digital amplifier includes a digital PWM generator, a first amplifier circuit, a first low-pass filter, a second amplifier circuit, a second low-pass filter, an attenuator, an error extractor, an adder, and a voltage supply unit. The first amplifier circuit amplifies a digital PWM signal at a second voltage. The first low-pass filter extracts a low-frequency band voltage signal from the amplified digital PWM signal, and outputs the extracted voltage signal to a load. The second amplifier circuit amplifies the generated digital PWM signal at a third voltage. The error extractor extracts an error signal. The adder adds a digital error signal whose feedback gain is adjusted to a digital audio signal. The voltage supply unit generates the third voltage that has a voltage value of a predetermined ratio to a voltage value of the second voltage, and supplies the third voltage to the second amplifier circuit.

6 Claims, 14 Drawing Sheets

DIGITAL AMPLIFIER

The present application claims the benefit of foreign priority of Japanese patent application 2017-142242 filed on Jul. 21, 2017, the contents all of which are incorporated herein by reference.

BACKGROUND

1. Technical Field

The present disclosure relates to a digital amplifier used for amplification of an audio signal, for example.

2. Description of the Related Art

Conventionally, a digital amplifier used for amplification of an audio signal has been proposed (refer to Japanese Patent No. 3346581). By extracting and feeding back distortion of an output, which is generated by an amplifier circuit or other circuits, as an error, this digital amplifier reduces the distortion.

SUMMARY

The present disclosure provides a digital amplifier capable of flattening a frequency characteristic of an output voltage.

A digital amplifier according to an aspect of the present disclosure includes a digital pulse width modulation (PWM) generator, a first amplifier circuit, a first low-pass filter, a second amplifier circuit, a second low-pass filter, an attenuator, an error extractor, a digital error signal generator, an adder, and a voltage supply unit. The digital PWM generator generates a digital PWM signal corresponding to a digital audio signal by using a first voltage. The first amplifier circuit amplifies the digital PWM signal at a second voltage whose absolute value is larger than the first voltage. The first low-pass filter extracts low-frequency components, as a first analog voltage signal, from a first amplified digital PWM signal amplified by the first amplifier circuit, and outputs the low-frequency components to a load. The second amplifier circuit amplifies the digital PWM signal at a third voltage whose absolute value is smaller than the second voltage. The second low-pass filter extracts low-frequency components, as a second analog voltage signal, from a second amplified digital PWM signal amplified by the second amplifier circuit. The attenuator attenuates the first analog voltage signal extracted by the first low-pass filter to generate a first attenuated analog voltage signal. The error extractor extracts an error signal based on the second analog voltage signal extracted by the second low-pass filter and the first attenuated analog voltage signal generated by the attenuator. The digital error signal generator generates, from the error signal, a digital error signal whose feedback gain is adjusted, the digital error being generated by digitizing the error signal. The adder adds the digital error signal to the digital audio signal. The voltage supply unit generates the third voltage that has a voltage value of a predetermined ratio to a voltage value of the second voltage by using the second voltage, and supplies the third voltage to at least the second amplifier circuit.

Note that those comprehensive or specific aspects may be implemented by a system, a method, an integrated circuit, a computer program, or a computer-readable recording medium such as a compact disc read-only memory (CD-ROM), or may be implemented by any combination of the system, the method, the integrated circuit, the computer program, and the recording medium.

A digital amplifier according to the present disclosure is capable of flattening a frequency characteristic of an output voltage.

DETAILED DESCRIPTION

Prior to describing exemplary embodiments of the present disclosure, problems found in a conventional technique will be now briefly described herein. The digital amplifier described in a section of "BACKGROUND" has a problem in which a frequency characteristic of an output voltage cannot be flattened. In other words, with respect to an audio signal, a gain of a low-frequency band is different from a gain of a high-frequency band.

(Knowledge Underlying the Present Disclosure)

The digital amplifier described in the section of "BACKGROUND" causes the following problems. First, a configuration and problems of the non-feedback digital amplifier will be described.

Figure 1:
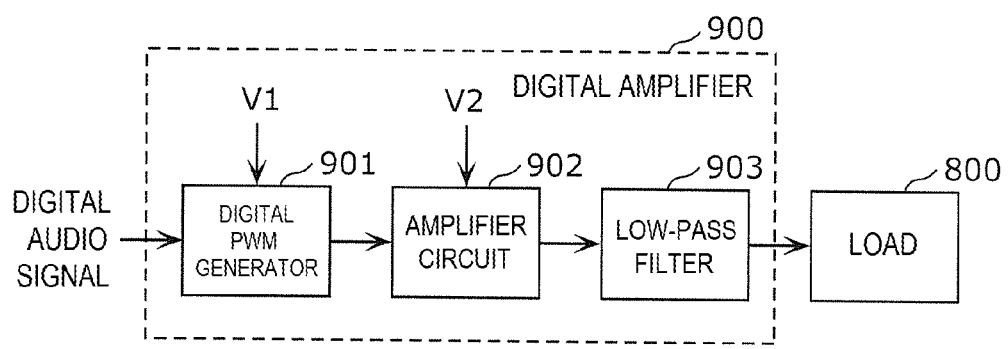
FIG. 1 is a configuration diagram of a non-feedback digital amplifier.

FIG. 1 is a configuration diagram of the non-feedback digital amplifier.

Non-feedback digital amplifier 900 is an amplifier that outputs an analog voltage signal corresponding to a digital audio signal to load 800, and includes digital pulse width modulation (PWM) generator 901, amplifier circuit 902, and low-pass filter 903.

Digital PWM generator 901 operates using voltage V1 as a power supply voltage, and generates and outputs a digital PWM signal based on the digital audio signal.

Amplifier circuit 902 operates using voltage V2 as the power supply voltage, and amplifies the digital PWM signal. Note that voltage V1 is supplied from, for example, a stabilized power supply, but has no synchronism with voltage V2. Voltage V2 includes a variation factor.

Low-pass filter 903 converts the amplified digital PWM signal into an analog voltage signal, and outputs the voltage signal to load 800.

Load 800 is, for example, a speaker, and generates acoustic energy corresponding to the voltage signal output from low-pass filter 903.

Figure 2:
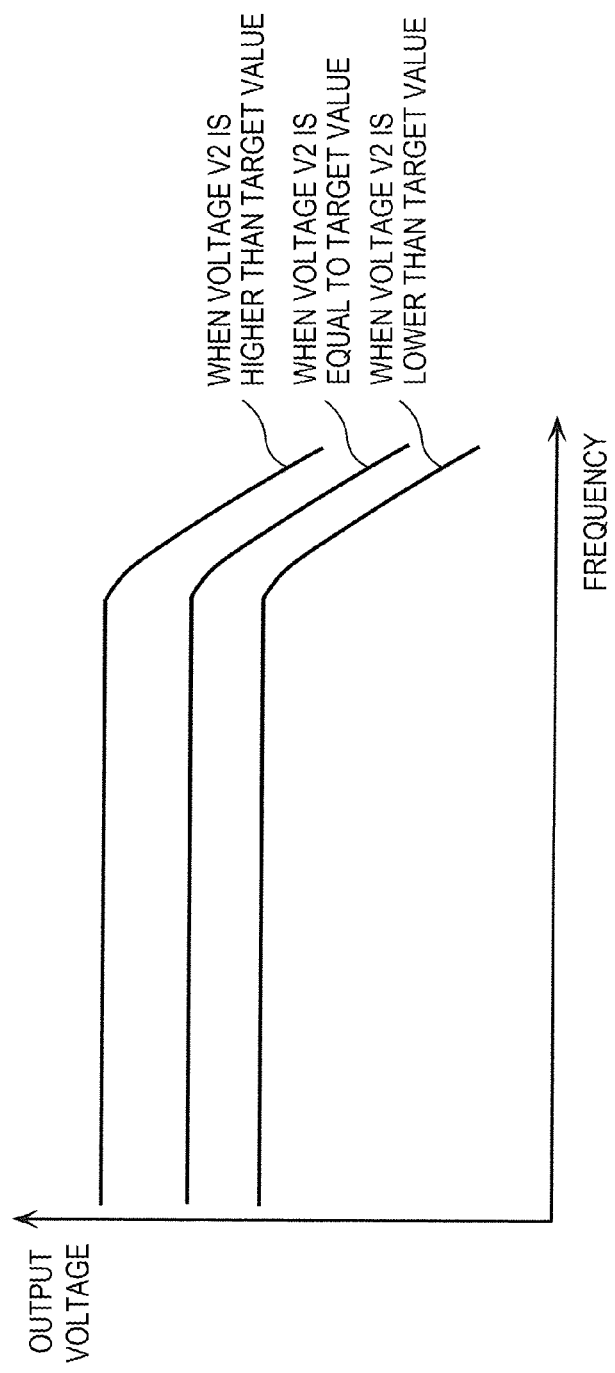
FIG. 2 is a graph illustrating frequency characteristics of an output voltage of the non-feedback digital amplifier.

FIG. 2 is a graph illustrating frequency characteristics of an output voltage of non-feedback digital amplifier 900.

As illustrated in FIG. 2, the output voltage from digital amplifier 900, that is, the output voltage from low-pass filter 903 is kept constant over a wide frequency band. However, when voltage V2 fluctuates, the output voltage also fluctuates based on the fluctuation of voltage V2.

The voltage signal output from digital amplifier 900 includes a distortion component caused by processes of amplifier circuit 902 and low-pass filter 903. In other words, the voltage signal includes an error. To solve this problem, a digital amplifier that extracts and feeds back an error that is such a distortion component to reduce the error has been proposed.

Figure 3:
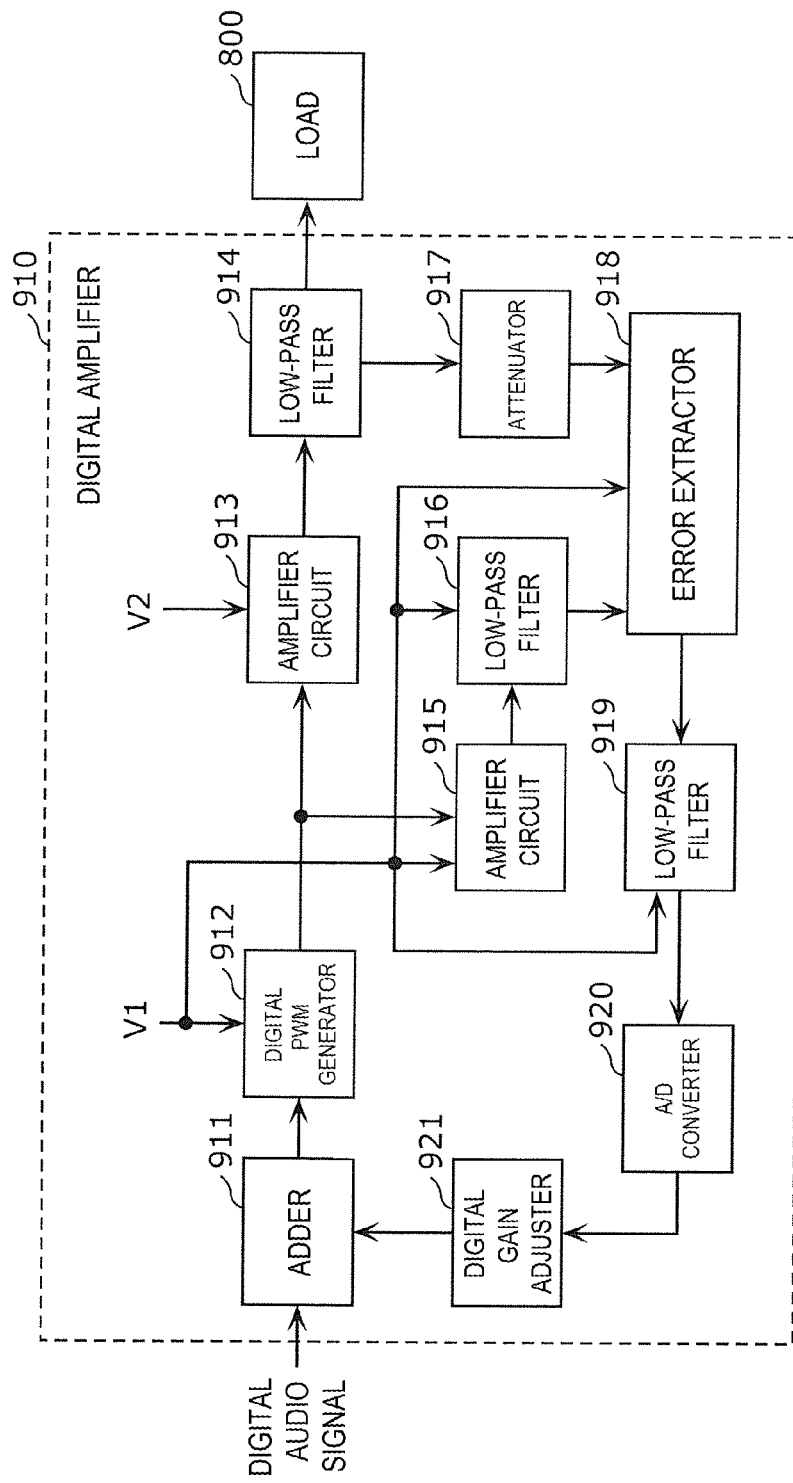
FIG. 3 is a diagram illustrating a configuration example of a digital amplifier that detects and feeds back an error.

FIG. 3 is a diagram illustrating a configuration example of the digital amplifier that detects and feeds back an error.

Digital amplifier 910 includes adder 911, digital PWM generator 912, amplifier circuit 913, low-pass filter 914, amplifier circuit 915, low-pass filter 916, attenuator 917, error extractor 918, low-pass filter 919, analog-to-digital (A/D) converter 920, and digital gain adjuster 921.

Digital PWM generator 912, amplifier circuit 913, and low-pass filter 914 respectively correspond to digital PWM generator 901, amplifier circuit 902, and low-pass filter 903 in non-feedback digital amplifier 900 described above.

Amplifier circuit 915 operates using voltage V1 as a power supply voltage, and amplifies a digital PWM signal. An amplification factor of amplifier circuit 915 is a product of an amplification factor of amplifier circuit 913 and an attenuation factor of attenuator 917, for example.

Low-pass filter 916 operates using voltage V1 as the power supply voltage, converts the digital PWM signal amplified by amplifier circuit 915 into an analog voltage signal, and outputs the voltage signal.

Attenuator 917 attenuates the voltage signal output from low-pass filter 914 with a predetermined attenuation factor.

Error extractor 918 operates using voltage V1 as the power supply voltage, and extracts, as an error signal, an error that is a difference between the voltage signal output from low-pass filter 916 and the voltage signal attenuated by attenuator 917.

Low-pass filter 919 outputs low-frequency components of the extracted error signal to A/D converter 920.

A/D converter 920 converts the low-frequency components of the error signal into a digital signal.

Digital gain adjuster 921 outputs a digital error signal whose feedback gain is adjusted based on the digital signal obtained from the conversion by A/D converter 920.

Adder 911 adds the digital error signal whose feedback gain is adjusted to the digital audio signal. A digital audio signal to which an inverse characteristic of the error signal has been applied beforehand is thus output to digital PWM generator 912.

Figure 4:
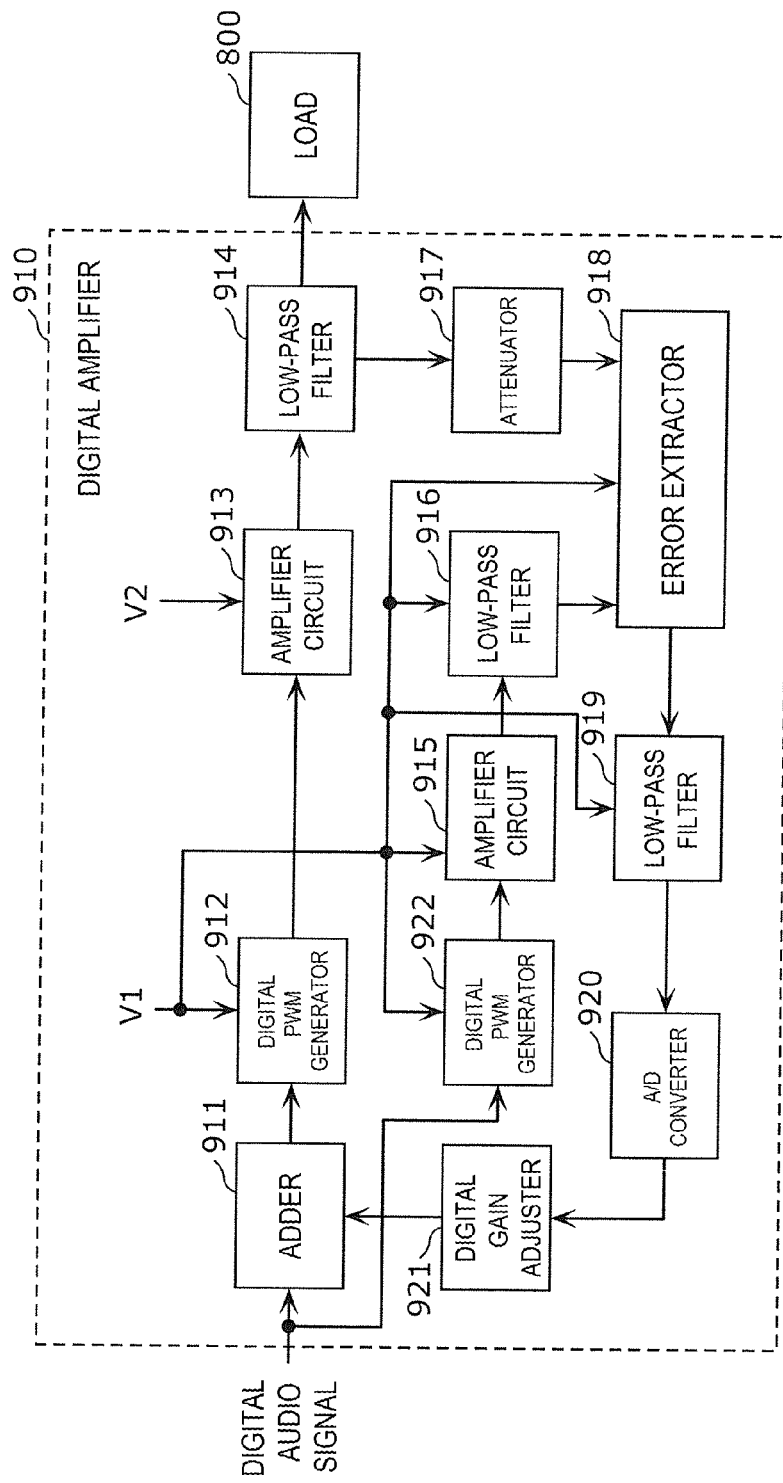
FIG. 4 is a diagram illustrating another configuration example of the digital amplifier that detects and feeds back an error.

FIG. 4 is a diagram illustrating another configuration example of digital amplifier 910 that detects and feeds back an error.

Digital amplifier 910 may further include digital PWM generator 922. Digital PWM generator 922 converts a digital audio signal into a digital PWM signal. Amplifier circuit 915 amplifies the digital PWM signal. Digital PWM generator 922 generates a signal for comparison that is used by error extractor 918. Then, a digital error signal whose feedback gain is adjusted by digital gain adjuster 921 is added to the digital audio signal by adder 911. A digital PWM signal to which an inverse characteristic of the error signal has been applied beforehand is thus output to amplifier circuit 913.

In digital amplifier 910, feeding back the error signal can reduce the error in the output voltage of digital amplifier 910.

However, when digital amplifier 910 is mounted on a vehicle, voltage V1 is supplied from, for example, a stabilized power supply, but has no synchronism with voltage V2, similar to non-feedback digital amplifier 900. Further, voltage V2 obtained from a battery of the vehicle includes a variation factor. As a result, a new problem arises in the frequency characteristic and the like.

Figure 5:
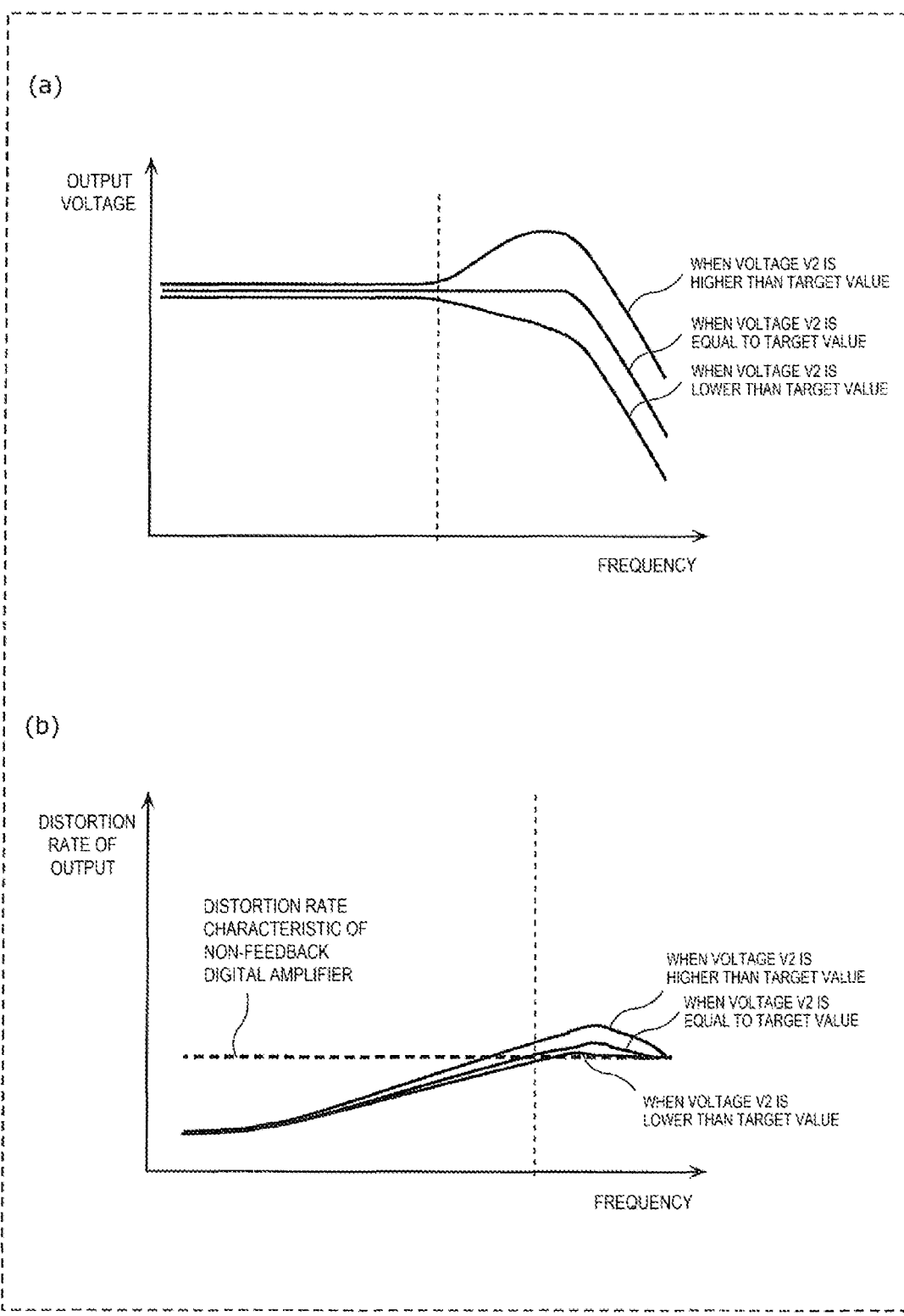
FIG. 5 is a graph illustrating frequency characteristics of the digital amplifier that detects and feeds back an error.

FIG. 5 is a graph illustrating frequency characteristics of digital amplifier 910. More specifically, part (a) of FIG. 5 illustrates a relationship between an output voltage of digital amplifier 910 and a frequency, and part (b) of FIG. 5 illustrates a relationship between a distortion rate of an output of digital amplifier 910 and a frequency.

As illustrated in part (a) of FIG. 5, voltage V2 causes a small fluctuation of the output voltage of digital amplifier 910 up to a frequency limited by low-pass filter 916 and the like. In other words, an output voltage of digital amplifier 910 with voltage V2 higher than a target value and an output voltage of digital amplifier 910 with voltage V2 lower than the target value are close to an output voltage of digital amplifier 910 with voltage V2 equal to the target value, up to the frequency limited by low-pass filter 916 and the like. However, in a frequency band higher than the limited frequency, the output voltage of digital amplifier 910 fluctuates based on a frequency and is not constant.

As illustrated in part (b) of FIG. 5, the distortion rate of the output of digital amplifier 910 is suppressed smaller than a distortion rate of an output of non-feedback digital amplifier 900 up to the frequency limited by low-pass filter 916 and the like. However, the distortion rate of digital amplifier 910 has dependency on voltage V2.

Furthermore, when voltage V2 varies in such a manner that voltage amplitude of the low-frequency components of the error signal applied to A/D converter 920 exceeds an input range of A/D converter 920, the frequency characteristics illustrated in parts (a) and (b) of FIG. 5 are further deteriorated.

Digital amplifier 910 substantially corresponds to a digital amplifier disclosed in Japanese Patent No. 3346581. In other words, in the digital amplifier disclosed in Japanese Patent No. 3346581, upon extracting an error, when a power supply voltage of an amplifier circuit that drives a speaker varies, an extracted error signal includes a signal itself in addition to the error. In addition, based on bandwidth limiting when the error is amplified and fed back, a difference in gain arises between a band to which a feedback gain is applied and a band to which no feedback gain is applied, whereby the frequency characteristic of the output voltage is not flattened. Further, an error feedback circuit using a well-known A/D converter has a problem in which this A/D converter is saturated when handling a signal out of a feedback band, thereby increasing distortion in such a case. When control for suppressing the saturation of the A/D converter is performed, a fluctuation in gain arises with voltage V2 fluctuating, which is also a problem.

To solve such problems, a digital amplifier according to an aspect of the present disclosure includes a digital PWM generator, a first amplifier circuit, a first low-pass filter, a second amplifier circuit, a second low-pass filter, a first attenuator, an error extractor, a digital error signal generator, an adder, and a voltage supply unit. The digital PWM generator generates a digital PWM signal corresponding to a digital audio signal by using a first voltage. The first amplifier circuit amplifies the digital PWM signal at a second voltage whose absolute value is larger than the first voltage. The first low-pass filter extracts low-frequency components, as a first analog voltage signal, from a first amplified digital PWM signal amplified by the first amplifier circuit, and outputs the low-frequency components to a load. The second amplifier circuit amplifies the digital PWM signal at a third voltage whose absolute value is smaller than the second voltage. The second low-pass filter extracts low-frequency components, as a second analog voltage signal, from a second amplified digital PWM signal amplified by the second amplifier circuit. The first attenuator attenuates the first analog voltage signal extracted by the first low-pass filter to generate a first attenuated analog voltage signal. The error extractor extracts an error signal based on the second analog voltage signal extracted by the second low-pass filter and the first attenuated analog voltage signal generated by the first attenuator. The digital error signal generator generates, from the error signal, a digital error signal whose feedback gain is adjusted, the digital error signal being generated by digitizing the error signal. The adder adds the digital error signal to the digital audio signal. The voltage supply unit generates the third voltage that has a voltage value of a predetermined ratio to a voltage value of the second voltage by using the second voltage, and supplies the third voltage to at least the second amplifier circuit. For example, an amplification factor of the second amplifier circuit may be equal to a product of an amplification factor of the first amplifier circuit and an attenuation factor of the first attenuator.

This configuration keeps a ratio of the second voltage used for amplification of the first amplifier circuit to the third voltage used for amplification of the second amplifier circuit so as to be constant. Accordingly, a frequency characteristic of an output voltage of the digital amplifier can be made flattened while suppressing a signal itself other than the error from being involved in the error signal. Furthermore, an influence of the second voltage on distortion of the output can also be suppressed.

The digital amplifier further includes a third amplifier circuit, a second attenuator, a second error extractor, and a digital gain adjuster. The third amplifier circuit amplifies the first voltage. The second attenuator attenuates the second voltage. The second error extractor extracts a difference between the first amplified voltage amplified by the third amplifier circuit and the second voltage attenuated by the second attenuator as a differential signal. The digital gain adjuster increases or decreases a sound volume of the digital audio signal based on the differential signal extracted by the second error extractor.

This configuration can keep the output voltage of the digital amplifier so as to be constant, because the sound volume of the digital audio signal is increased or decreased based on the differential signal even when the second voltage fluctuates. In other words, a gain of the digital amplifier can be kept constant regardless of voltage V2.

Furthermore, to solve the above-described problems, a digital amplifier according to another aspect of the present disclosure includes a digital PWM generator, a first amplifier circuit, a first low-pass filter, a second amplifier circuit, a second low-pass filter, an attenuator, an error extractor, a digital error signal generator, an adder, and a voltage generation circuit. The digital PWM generator generates a digital PWM signal corresponding to a digital audio signal by using a first voltage. The first amplifier circuit amplifies the digital PWM signal at a second voltage whose absolute value is larger than the first voltage. The first low-pass filter extracts low-frequency components, as a first analog voltage signal, from a first amplified digital PWM signal amplified by the first amplifier circuit, and outputs the low-frequency components to a load. The second amplifier circuit amplifies the digital PWM signal at the first voltage. The second low-pass filter extracts low-frequency components, as a second analog voltage signal, from a second amplified digital PWM signal amplified by the second amplifier circuit. The attenuator attenuates the first analog voltage signal extracted by the first low-pass filter to generate a first attenuated analog voltage signal. The error extractor extracts an error signal based on the second analog voltage signal extracted by the second low-pass filter and the first attenuated analog voltage signal generated by the attenuator. The digital error signal generator generates, from the error signal, a digital error signal whose feedback gain is adjusted, the digital error signal being generated by digitizing the error signal. The adder adds the digital error signal to the digital audio signal. The voltage generation circuit generates the second voltage that has a voltage value of a predetermined ratio to a voltage value of the first voltage by using the third voltage, and supplies the second voltage to the first amplifier circuit. For example, an amplification factor of the second amplifier circuit may be a product of an amplification factor of the first amplifier circuit and an attenuation factor of the attenuator.

This configuration keeps a ratio of the second voltage used for amplification of the first amplifier circuit to the first voltage used for amplification of the second amplifier circuit so as to be constant. Accordingly, a frequency characteristic of an output voltage of the digital amplifier can be made flattened while suppressing a signal itself other than the error from being involved in the error signal. Furthermore, an influence of the third voltage on distortion of the output can also be suppressed. Further, the second voltage is generated using the third voltage so as to have the voltage value of the predetermined ratio to the voltage value of the first voltage. Accordingly, even when the third voltage fluctuates, the output voltage of the digital amplifier can be kept constant. In other words, a gain can be kept constant regardless of the third voltage.

Note that those comprehensive or specific aspects may be implemented by a system, a method, an integrated circuit, a computer program, or a computer-readable recording medium such as a CD-ROM, or may be implemented by any combination of the system, the method, the integrated circuit, the computer program, and the recording medium.

Hereinafter, exemplary embodiments will specifically be described with reference to the drawings.

Note that the following exemplary embodiments provide comprehensive or specific examples of the present disclosure. Numerical values, shapes, materials, constituent elements, arrangement positions and connection modes of the constituent elements, steps, order of the steps, and the like illustrated in the following exemplary embodiments are merely examples, and therefore are not intended to limit the present disclosure. Among constituent elements in the following exemplary embodiment, the constituent element that is not recited in the independent claim indicating the broadest concept is described as an optional constituent element.

It should be noted that each of the diagrams is schematic, and is not necessarily strictly accurate. Further, in each diagram, the same components are denoted by the same reference marks.

(First Exemplary Embodiment)

Figure 6:
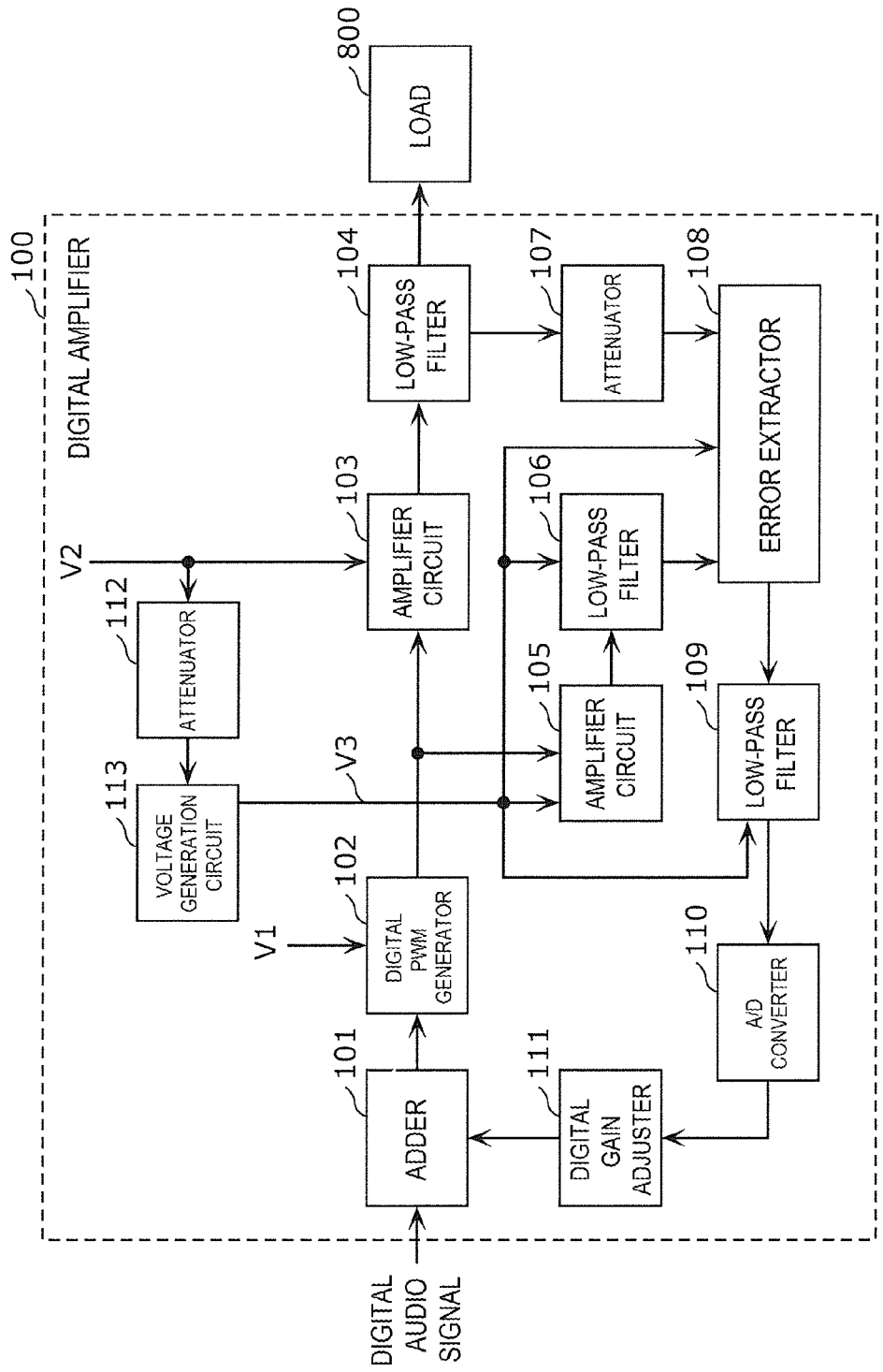
FIG. 6 is a diagram illustrating a configuration example of a digital amplifier according to a first exemplary embodiment.

FIG. 6 is a diagram illustrating a configuration example of a digital amplifier according to a first exemplary embodiment.

Digital amplifier 100 according to the present exemplary embodiment is an amplifier in which a distortion component involved in an output voltage is reduced, and a frequency characteristic of the output voltage is flattened. More specifically, digital amplifier 100 includes adder 101, digital PWM generator 102, amplifier circuit 103, low-pass filter 104, amplifier circuit 105, low-pass filter 106, attenuator 107, error extractor 108, low-pass filter 109, A/D converter 110, digital gain adjuster 111, attenuator 112, and voltage generation circuit 113. Note that constituent elements other than attenuator 112 and voltage generation circuit 113 in digital amplifier 100 relate to respective constituent elements in digital amplifier 910.

Digital PWM generator 102 generates a digital PWM signal corresponding to a digital audio signal by using voltage V1 that is a first voltage. In other words, digital PWM generator 102 operates using voltage V1 as a power supply voltage, and generates and outputs the digital PWM signal based on the digital audio signal that is output from adder 101 and has been subjected to gain adjustment. A peak voltage of this digital PWM signal is adjusted by digital PWM generator 102 to, for example, voltage V1. Voltage V1 is, for example, 3.3 V.

Amplifier circuit 103 is a first amplifier circuit that amplifies the digital PWM signal at voltage V2 that is a second voltage whose absolute value is larger than voltage V1. In other words, amplifier circuit 103 operates using voltage V2 as the power supply voltage, and amplifies the digital PWM signal. For example, the peak voltage of the digital PWM signal is amplified from voltage V1 to voltage V2. Voltage V2 is in a range from 25 V to 60 V, for example.

Low-pass filter 104 is a first low-pass filter that extracts low-frequency components, as an analog voltage signal, from the digital PWM signal amplified by amplifier circuit 103, and outputs the low-frequency components to load 800. In other words, low-pass filter 104 converts the amplified digital PWM signal into an analog signal, and outputs the analog voltage signal that is the analog signal to load 800.

Amplifier circuit 105 is a second amplifier circuit that amplifies the digital PWM signal generated by digital PWM generator 102 at voltage V3 that is a third voltage whose absolute value is smaller than that of voltage V2. In other words, amplifier circuit 105 operates using voltage V3 as the power supply voltage, and amplifies the digital PWM signal at voltage V3. For example, the peak voltage of the digital PWM signal is amplified from voltage V1 to voltage V3. Corresponding to respective voltage values of voltage V2 and voltage V3, an amplification factor of amplifier circuit 105 is made equal to a product of an amplification factor of amplifier circuit 103 and an attenuation factor of attenuator 107.

Low-pass filter 106 is a second low-pass filter that extracts low-frequency components, as an analog voltage signal, from the digital PWM signal amplified by amplifier circuit 105. That is, low-pass filter 106 operates using voltage V3 as the power supply voltage, converts the digital PWM signal amplified by amplifier circuit 105 into an analog signal, and outputs the analog voltage signal that is the analog signal. In other words, low-pass filter 106 demodulates the digital PWM signal to generate the analog signal, and has the same low-pass filtering characteristic as that obtained from low-pass filter 104 and load 800.

Attenuator 107 is a first attenuator that attenuates the analog voltage signal extracted by low-pass filter 104 to generate an attenuated analog voltage signal. In other words, attenuator 107 attenuates the voltage signal output from low-pass filter 104 corresponding to a predetermined attenuation factor. The attenuation factor is the reciprocal of the amplification factor of amplifier circuit 103, for example.

Error extractor 108 extracts an error signal based on the analog voltage signal extracted by low-pass filter 106 and the attenuated analog voltage signal generated by attenuator 107. More specifically, error extractor 108 operates using voltage V3 as the power supply voltage, and extracts, as the error signal, an error that is a difference between the voltage signal output from low-pass filter 106 and the voltage signal attenuated by attenuator 107.

Low-pass filter 109 outputs low-frequency components of the error signal extracted by error extractor 108 to A/D converter 110. Low-pass filter 109 attenuates frequency components that are not less than a Nyquist frequency of A/D converter 110 and included in the error signal to, for example, −100 dB. As a result, the low-frequency components included in the error signal are output to A/D converter 110. Removing the frequency components not less than the Nyquist frequency can reduce folding distortion caused by A/D converter 110.

A/D converter 110 converts the low-frequency components of the error signal into a digital signal.

Digital gain adjuster 111 outputs a digital error signal whose feedback gain is adjusted based on the digital signal obtained from the conversion by A/D converter 110. Herein, A/D converter 110 and digital gain adjuster 111 correspond to a digital error signal generator that generates, from the error signal, a digital error signal whose feedback gain is adjusted, the digital error signal being generated by digitizing the error signal.

Adder 101 adds the digital error signal whose feedback gain is adjusted to the digital audio signal. A digital audio signal to which an inverse characteristic of the error signal is applied beforehand is thus output to digital PWM generator 102.

Herein, in the present exemplary embodiment, attenuator 112 attenuates voltage V2 with a predetermined attenuation factor, and outputs attenuated voltage V2 to voltage generation circuit 113. For example, the attenuation factor of attenuator 112 is the same as the attenuation factor of attenuator 107. In this case, the amplification factor of amplifier circuit 105 is 1, for example.

Then voltage generation circuit 113 supplies voltage V3 set corresponding to the attenuation factor of attenuator 112 with voltage V2 as a reference to amplifier circuit 105, low-pass filter 106, error extractor 108, and low-pass filter 109.

In other words, attenuator 112 and voltage generation circuit 113 according to the present exemplary embodiment configure a voltage supply unit that generates voltage V3 having a voltage value of a predetermined ratio to a voltage value of voltage V2 by using voltage V2, and supplies voltage V3 to at least amplifier circuit 105. Note that voltage generation circuit 113 may be an impedance conversion circuit. Amplifier circuit 105, low-pass filter 106, error extractor 108, and low-pass filter 109 each operate using voltage V3 as the power supply voltage. Those constituent elements may operate taking a voltage half of voltage V3 as a middle point voltage, for example.

Load 800 generates acoustic energy corresponding to the voltage signal output from low-pass filter 104 of digital amplifier 100. For example, load 800 is a speaker for reproducing music.

Figure 7:
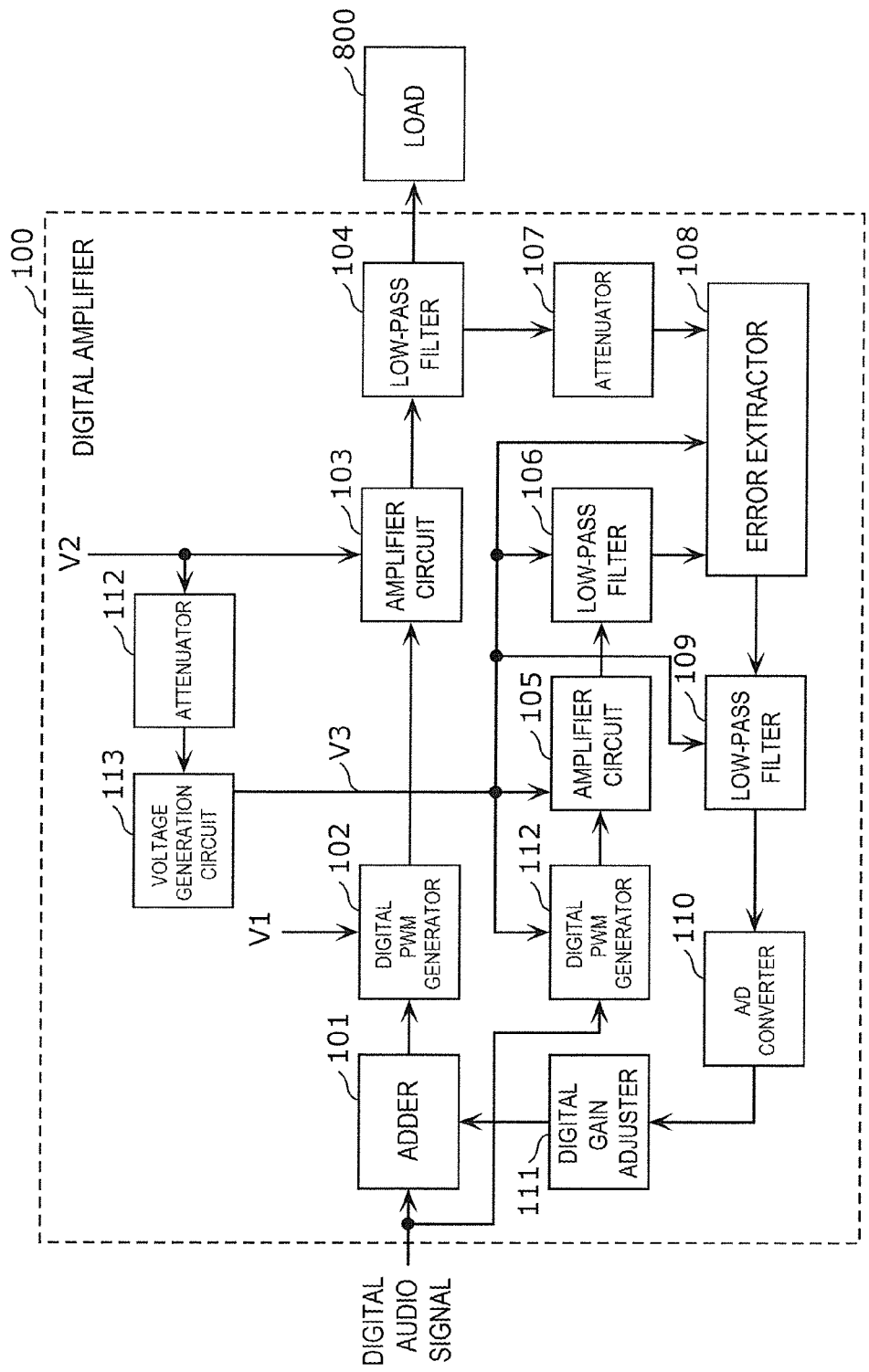
FIG. 7 is a diagram illustrating another configuration example of the digital amplifier according to the first exemplary embodiment.

FIG. 7 is a diagram illustrating another configuration example of digital amplifier 100 according to the first exemplary embodiment.

Digital amplifier 100 may further include digital PWM generator 114. Digital PWM generator 114 converts the digital audio signal into the digital PWM signal. Amplifier circuit 105 amplifies the digital PWM signal. Digital PWM generator 114 generates a signal for comparison that is used by error extractor 108. Then a digital error signal whose feedback gain is adjusted by digital gain adjuster 111 is added to the digital audio signal by adder 101. A digital PWM signal to which an inverse characteristic of the error signal has been applied beforehand is thus output to amplifier circuit 103.

In digital amplifier 100 thus configured according to the present exemplary embodiment, attenuator 112 and voltage generation circuit 113 can cause a ratio of voltage V3 supplied to amplifier circuit 105 to voltage V2 supplied to amplifier circuit 103 to be constant, regardless of a fluctuation of voltage V2.

Note that amplifier circuit 105 may be an inverter circuit that inverts a polarity of the digital PWM signal, or a circuit in which a plurality of inverter circuits are connected in stages. In this case, when a product of an amplification factor of amplifier circuit 103 and an attenuation factor of attenuator 107 is 1, an amplification factor of amplifier circuit 105 is −1. Error extractor 108 then extracts a sum of a voltage signal output from low-pass filter 106 and a voltage signal attenuated by attenuator 107 as the error signal.

Figure 8:
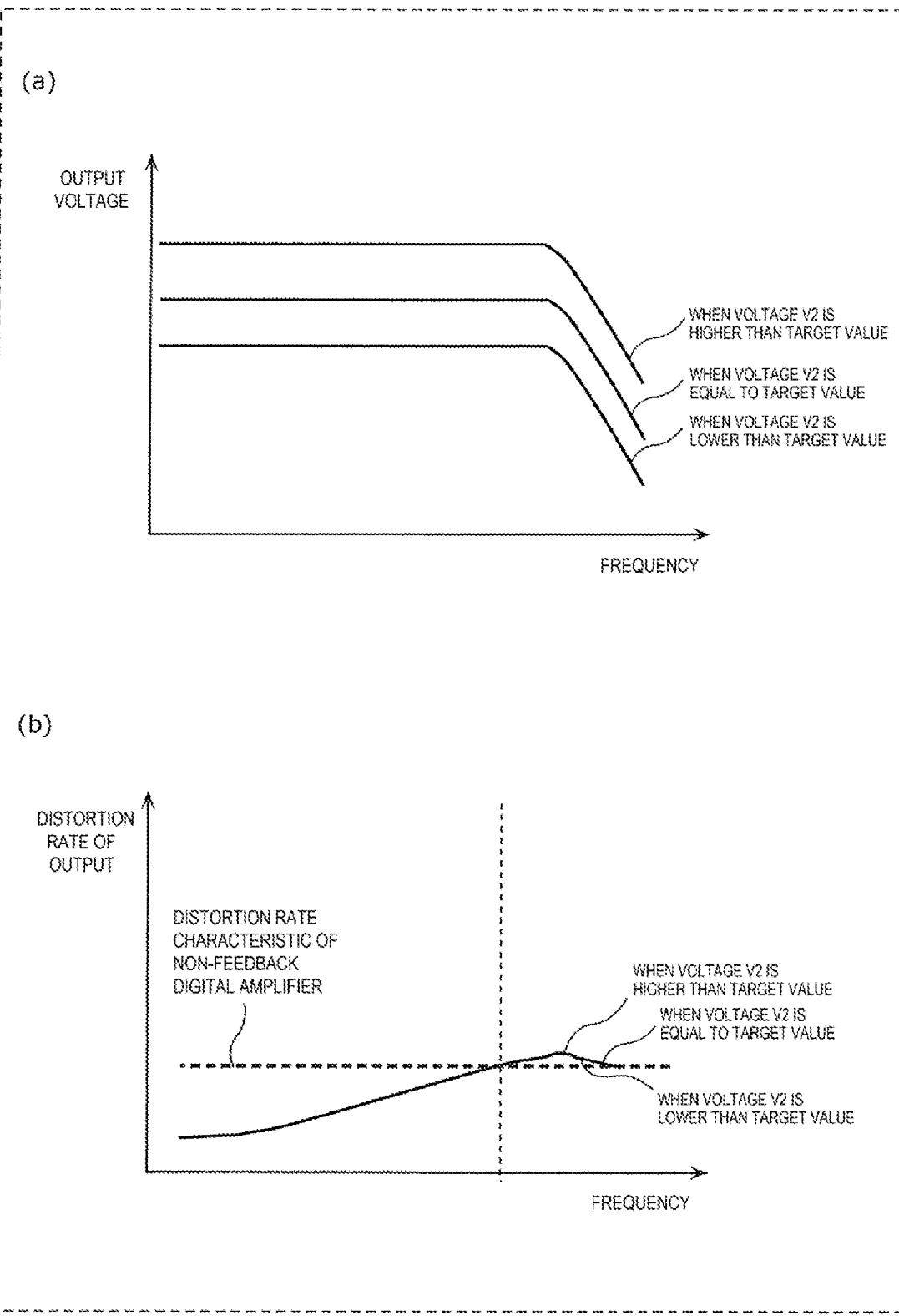
FIG. 8 is a graph illustrating frequency characteristics of the digital amplifier according to the first exemplary embodiment.

FIG. 8 is a graph illustrating frequency characteristics of digital amplifier 100 according to the present exemplary embodiment. More specifically, part (a) of FIG. 8 illustrates a relationship between an output voltage of digital amplifier 100 and a frequency, and part (b) of FIG. 8 illustrates a relationship between a distortion rate of an output of digital amplifier 100 and a frequency.

In digital amplifier 100 according to present exemplary embodiment, as illustrated in part (a) of FIG. 8, the frequency characteristic of the output voltage can be flattened in comparison with the example illustrated in part (a) of FIG. 5. In other words, the output voltage of digital amplifier 100 can be flattened, or be made constant over a wide frequency band.

Note that, in general, when an open loop gain of an amplifier circuit is set to, for example, 100 dB, a gain of a circuit having negative feedback can be determined by a feedback gain independently of a power supply voltage. Accordingly, a gain of the amplifier circuit in the circuit having the negative feedback is determined by open loop gain-feedback gain. However, in a fully digitized amplifier configured with a digital PWM processor and an amplifier circuit, which are well known, its gain is determined by a power supply voltage. Accordingly, digital amplifier 100 according to the present exemplary embodiment has a characteristic in which the output voltage, that is, the gain varies based on voltage V2, as illustrated in part (a) of FIG. 8.

Further, as illustrated in part (b) of FIG. 8, a distortion rate of an output of digital amplifier 100 according to the present exemplary embodiment is suppressed smaller than a distortion rate of an output of non-feedback digital amplifier 900 up to a frequency limited by low-pass filter 106 and the like. Furthermore, the distortion rate of digital amplifier 100 can be made constant independently of voltage V2. As a result, it is possible to suppress voltage amplitude of the low-frequency components of the error signal applied to A/D converter 110 from exceeding an input range of A/D converter 110.

Herein, in digital amplifier 100, the signal passes through low-pass filters 104, 106, and 109 that are configured in multiple stages, and the analog signal is converted into the digital signal by A/D converter 110. Accordingly, the digital error signal that is a feedback signal whose feedback gain described above is adjusted includes delay elements. Therefore distortion of the output can be corrected within a range limited to a low frequency band. Further, in the present exemplary embodiment, attenuator 112 and voltage generation circuit 113 configure a gain compensation circuit that compensates the voltage amplitude of the digital PWM signal that serves as a reference and is output from amplifier circuit 105. As a result, an output voltage of low-pass filter 104 for each frequency can be flattened while improving a non-linear component that is distortion of an output generated in amplifier circuit 103 and low-pass filter 104.

In other words, in digital amplifier 100 according to the present exemplary embodiment, attenuator 112 and voltage generation circuit 113 cause a ratio of voltage V2 that is the power supply voltage of amplifier circuit 103 to voltage V3 that is the power supply voltage of amplifier circuit 105 to be constant. Accordingly, the frequency characteristic of the output voltage can be flattened, and an influence of voltage V2 on the distortion of the output can be suppressed.

Further, the present exemplary embodiment can scale down a circuit for generating voltage V3, that is, a circuit configured with attenuator 112 and voltage generation circuit 113. When load 800 is a speaker, power consumed by amplifier circuit 103 amounts to several watts to several hundred watts. On the other hand, power consumed by amplifier circuit 105 using voltage V3 as the power supply voltage is supplied to a load whose impedance is several hundred ohms or more, and therefore is suppressed to $\frac{1}{10000}$ to $\frac{1}{100}$ of the power consumed by amplifier circuit 103. Accordingly, the circuit for generating voltage V3 can be scaled down. Therefore, digital amplifier 100 in the present exemplary embodiment can be mounted on a vehicle or consumer equipment in which voltage V2 is not stabilized.

(Second Exemplary Embodiment)

Figure 9:
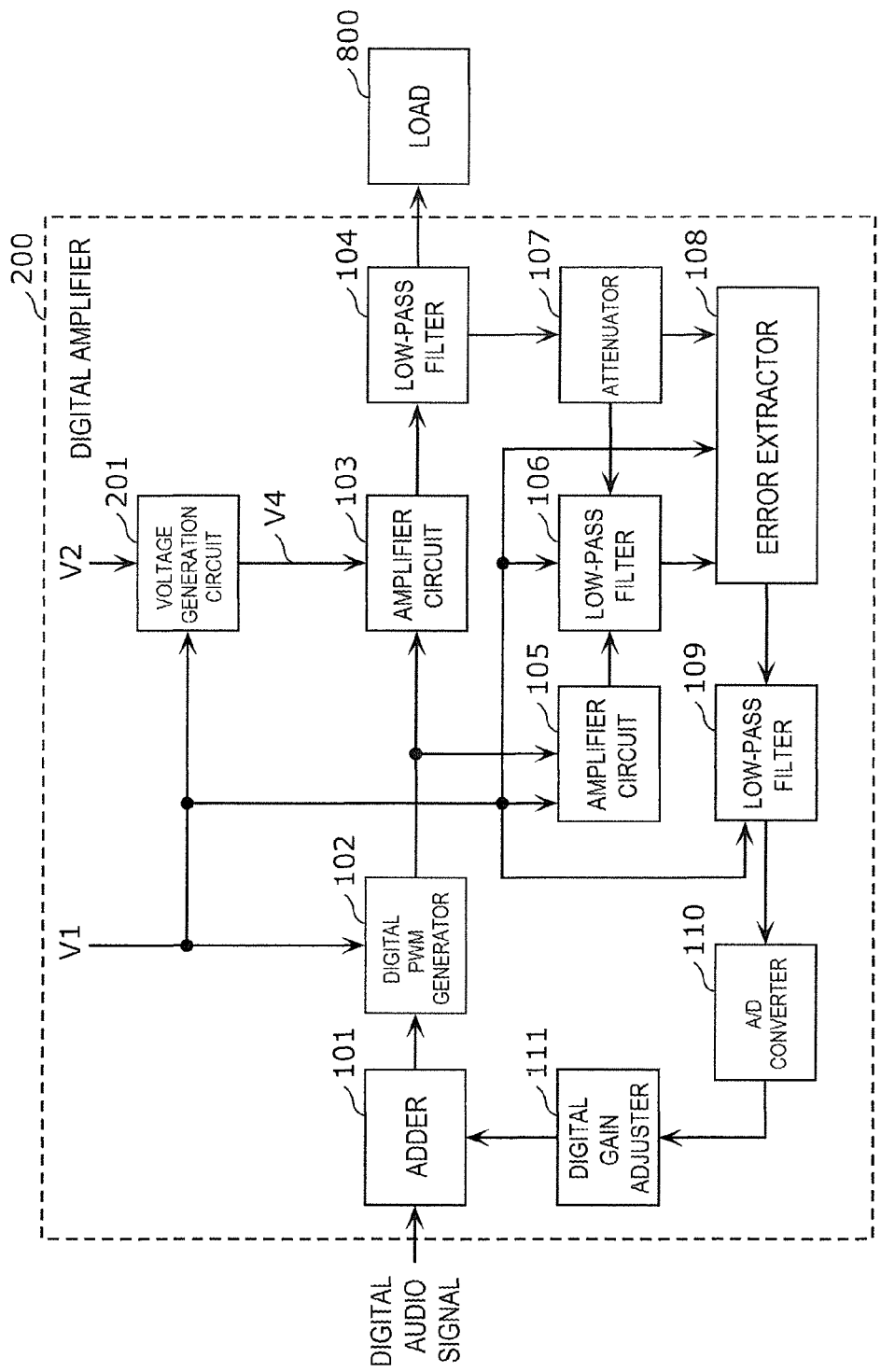
FIG. 9 is a diagram illustrating a configuration example of a digital amplifier according to a second exemplary embodiment.

FIG. 9 is a diagram illustrating a configuration example of a digital amplifier according to a second exemplary embodiment.

Similar to digital amplifier 100 according to the first exemplary embodiment, digital amplifier 200 according to the present exemplary embodiment includes adder 101, digital PWM generator 102, amplifier circuit 103, low-pass filter 104, amplifier circuit 105, low-pass filter 106, attenuator 107, error extractor 108, low-pass filter 109, A/D converter 110, and digital gain adjuster 111. Digital amplifier 200 according to the present exemplary embodiment further includes voltage generation circuit 201, instead of attenuator 112 and voltage generation circuit 113 of the first exemplary embodiment.

Note that, constituent elements of the present exemplary embodiment identical to constituent components of the first exemplary embodiment are denoted by numerals or symbols identical to numerals or symbols used in the first exemplary embodiment, and detailed descriptions of the constituent components are omitted.

Amplifier circuit 103 amplifies a digital PWM signal at voltage V4 that is a fourth voltage whose absolute value is larger than voltage V1.

Amplifier circuit 105 amplifies the digital PWM signal generated by digital PWM generator 102 at voltage V1.

Voltage generation circuit 201 generates voltage V4 that has a voltage value of a predetermined ratio to a voltage value of voltage V1 by using voltage V2, and supplies voltage V4 to amplifier circuit 103. In other words, voltage generation circuit 201 operates using voltage V2 as a power supply voltage, and generates voltage V4 based on voltage V1 to output voltage V4 to amplifier circuit 103. Voltage generation circuit 201 can perform both voltage boosting and voltage dropping, or can perform either voltage boosting or voltage dropping. Voltage V4 is set with voltage V1 as a reference. For example, a ratio of voltage V4 to voltage V1 is set equal to the reciprocal of an attenuation factor of attenuator 107. In this case, an amplification factor of amplifier circuit 105 is 1, for example. Note that voltage V1 is 3.3 V, and voltage V2 is in a range from 25 V to 60 V, for example.

Amplifier circuit 105, low-pass filter 106, error extractor 108, and low-pass filter 109 according to the present exemplary embodiment each operate using voltage V1 as the power supply voltage, similar to digital PWM generator 102. Those constituent elements may operate taking a voltage half of voltage V1 as a middle point voltage, for example. A peak voltage of the digital PWM signal amplified by amplifier circuit 105 may be voltage V1, for example. Corresponding to respective voltage values of voltage V1 and voltage V4, an amplification factor of amplifier circuit 105 is made equal to a product of an amplification factor of amplifier circuit 103 and an attenuation factor of attenuator 107.

Figure 10:
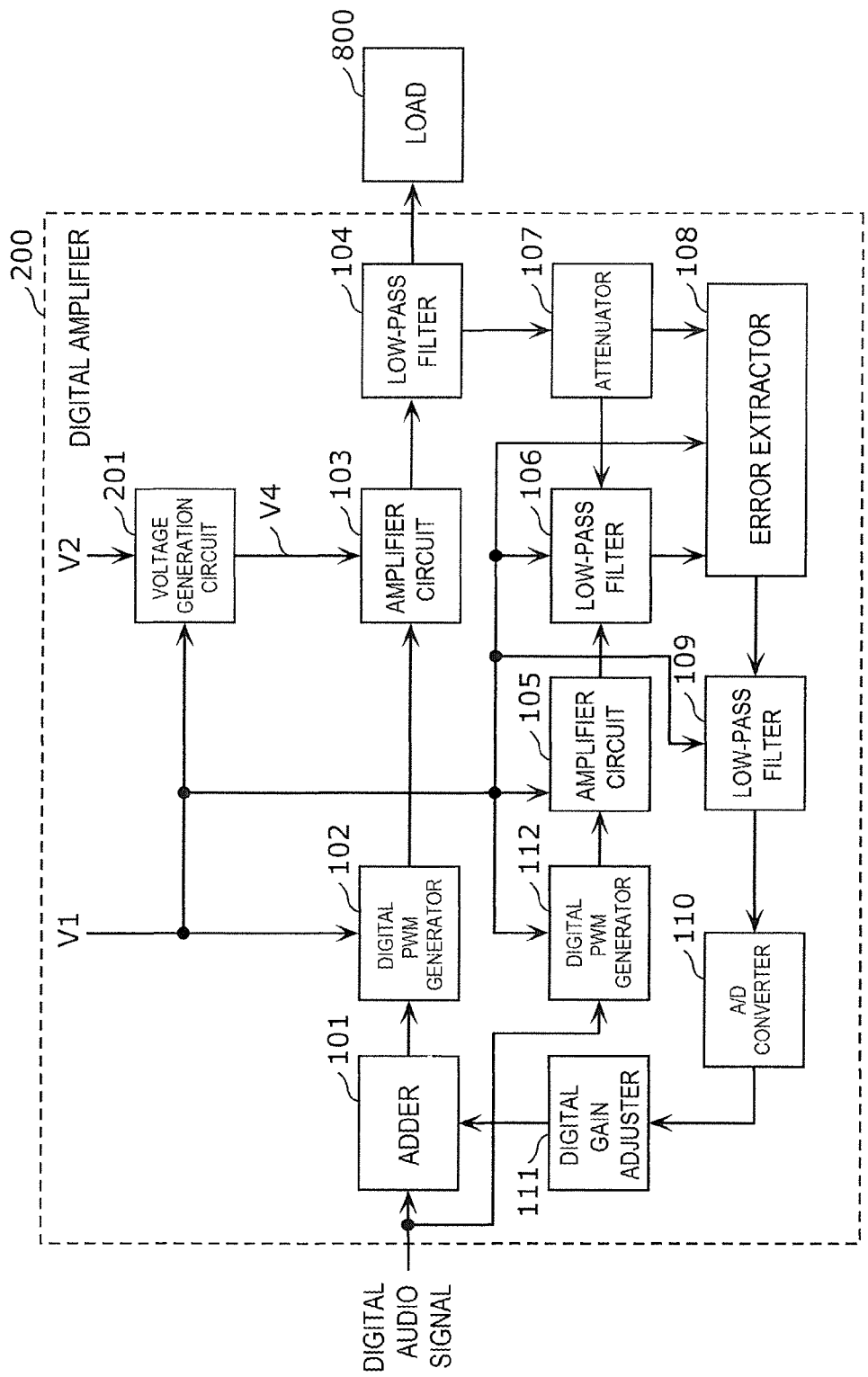
FIG. 10 is a diagram illustrating another configuration example of the digital amplifier according to the second exemplary embodiment.

FIG. 10 is a diagram illustrating another configuration example of digital amplifier 200 according to the second exemplary embodiment.

Digital amplifier 200 may further include digital PWM generator 114. Digital PWM generator 114 converts the digital audio signal into the digital PWM signal. Amplifier circuit 105 amplifies the digital PWM signal. Digital PWM generator 114 generates a signal for comparison that is used by error extractor 108. Then a digital error signal whose feedback gain is adjusted by digital gain adjuster 111 is added to the digital audio signal by adder 101. A digital PWM signal to which an inverse characteristic of the error signal has been applied beforehand is thus output to amplifier circuit 103.

In digital amplifier 200 thus configured according to the present exemplary embodiment, a ratio of voltage V1 supplied to amplifier circuit 105 to voltage V4 supplied to amplifier circuit 103 can be made constant, regardless of a fluctuation of voltage V2.

Figure 11:
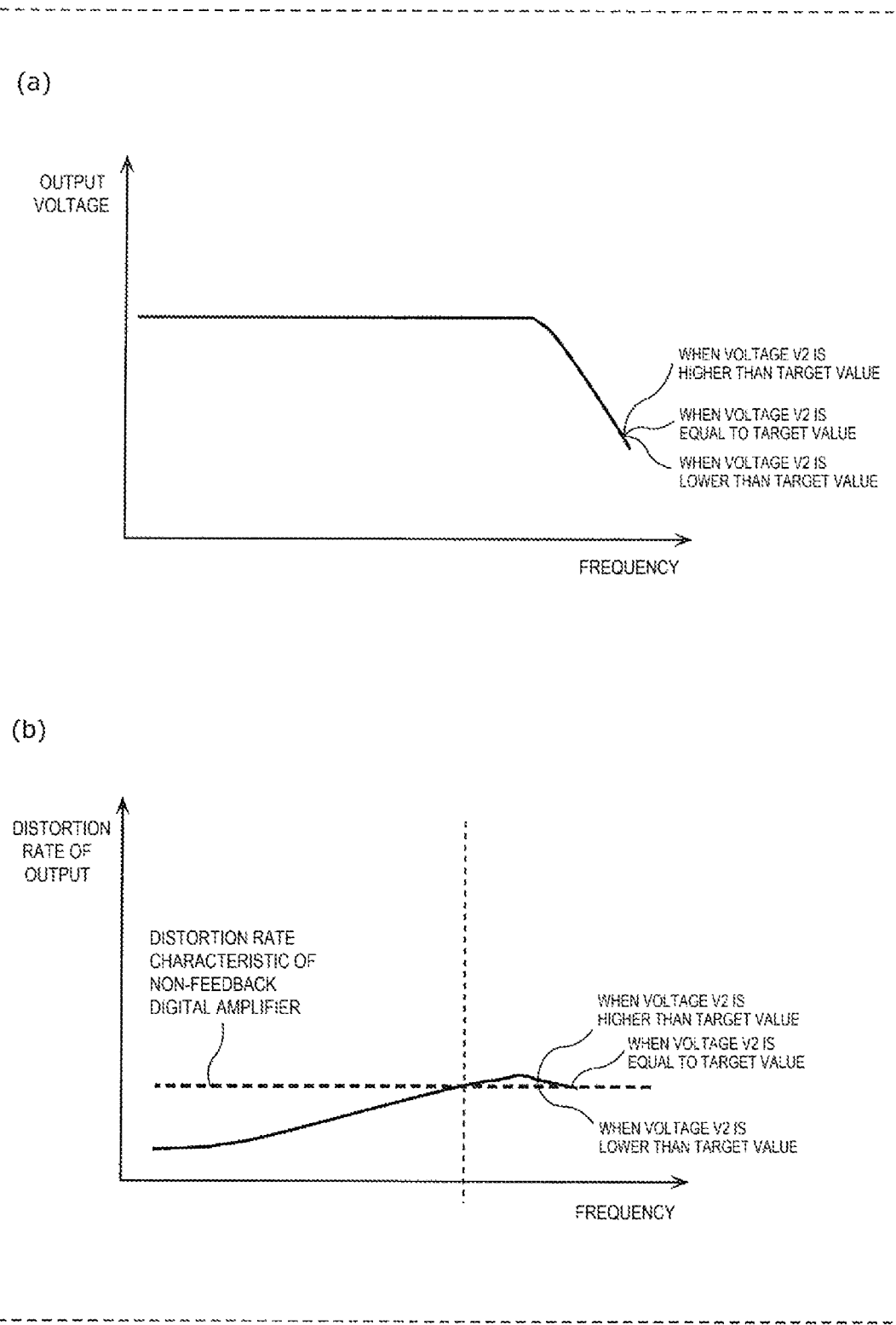
FIG. 11 is a graph illustrating frequency characteristics of the digital amplifier according to the second exemplary embodiment.

FIG. 11 is a graph illustrating frequency characteristics of digital amplifier 200 according to the present exemplary embodiment. More specifically, part (a) of FIG. 11 illustrates a relationship between an output voltage of digital amplifier 200 and a frequency, and part (b) of FIG. 11 illustrates a relationship between a distortion rate of an output of digital amplifier 200 and a frequency.

In digital amplifier 200 according to present exemplary embodiment, as illustrated in part (a) of FIG. 11, the frequency characteristic of the output voltage can be flattened in comparison with the example illustrated in part (a) of FIG. 5. In other words, the output voltage of digital amplifier 200 can be flattened, or be made constant over a wide frequency band. Furthermore, in the present exemplary embodiment, even when voltage V2 that is a second voltage fluctuates, the output voltage can be kept constant. In other words, a gain can be kept constant regardless of voltage V2. Accordingly, even when digital amplifier 200 mounted on a vehicle uses voltage V2 that can be obtained from a battery of the vehicle and includes a variation factor, digital amplifier 200 can amplify the digital PWM signal with a stable gain.

Further, as illustrated in part (b) of FIG. 11, the distortion rate of the output of digital amplifier 200 according to the present exemplary embodiment is suppressed smaller than a distortion rate of an output of non-feedback digital amplifier 900 up to a frequency limited by low-pass filter 106 and the like. Furthermore, the distortion rate of digital amplifier 100 can be made constant independently of voltage V2. As a result, it is possible to suppress voltage amplitude of the low-frequency components of the error signal applied to A/D converter 110 from exceeding an input range of A/D converter 110.

Herein, in digital amplifier 200, the signal passes through low-pass filters 104, 106, and 109 that are configured in multiple stages, and the analog signal is converted into the digital signal by A/D converter 110. Accordingly, the digital error signal that is a feedback signal whose feedback gain described above is adjusted includes delay elements. Therefore distortion of the output can be corrected within a range limited to a low frequency band. Further, in the present exemplary embodiment, voltage generation circuit 201 configures a gain compensation circuit that compensates the voltage amplitude of the digital PWM signal that serves as a reference and is output from amplifier circuit 105. As a result, an output voltage of low-pass filter 104 for each frequency can be flattened even when a power supply voltage of voltage V2 fluctuates, while improving a non-linear component that is distortion of an output generated in amplifier circuit 103 and low-pass filter 104. Further, even when voltage V2 fluctuates, a constant gain can be obtained in the output.

In other words, in digital amplifier 200 according to the present exemplary embodiment, voltage generation circuit 201 causes a ratio of voltage V4 that is the power supply voltage of amplifier circuit 103 to voltage V1 that is the power supply voltage of amplifier circuit 105 to be constant. Accordingly, the frequency characteristic of the output voltage can be flattened, and an influence of voltage V2 on the distortion of the output can be suppressed. Furthermore, voltage generation circuit 201 keeps voltage V4 constant. Therefore, a constant output voltage can be obtained even when voltage V2 fluctuates. Accordingly, digital amplifier 100 in the present exemplary embodiment can be mounted on a vehicle or consumer equipment, which has a stabilized power supply as voltage generation circuit 201.

(Third Exemplary Embodiment)

Figure 12:
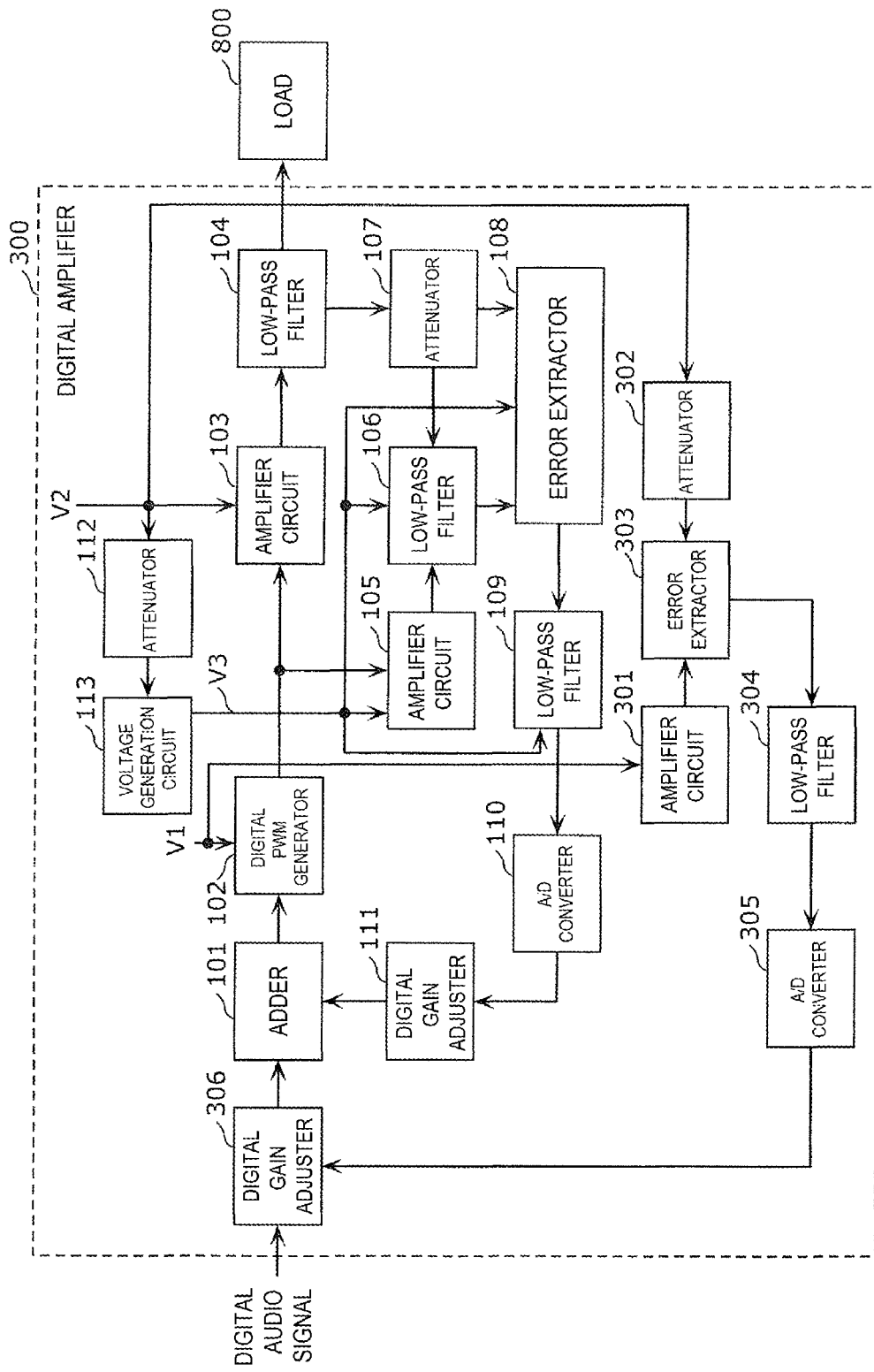
FIG. 12 is a diagram illustrating a configuration example of a digital amplifier according to a third exemplary embodiment.

FIG. 12 is a diagram illustrating a configuration example of a digital amplifier according to a third exemplary embodiment.

Similar to digital amplifier 100 according to the first exemplary embodiment, digital amplifier 300 according to the present exemplary embodiment includes adder 101, digital PWM generator 102, amplifier circuit 103, low-pass filter 104, amplifier circuit 105, low-pass filter 106, attenuator 107, error extractor 108, low-pass filter 109, A/D converter 110, and digital gain adjuster 111. Digital amplifier 300 according to the present exemplary embodiment further includes amplifier circuit 301, attenuator 302, error extractor 303, low-pass filter 304, A/D converter 305, and digital gain adjuster 306.

Note that, constituent elements identical to constituent components of the first exemplary embodiment are denoted by numerals or symbols identical to numerals or symbols used in the first exemplary embodiment, and detailed descriptions of the constituent components are omitted.

Amplifier circuit 301 is a third amplifier circuit that amplifies voltage V1 that is a first voltage. In other words, amplifier circuit 301 amplifies voltage V1 with a predetermined amplification factor to output amplified voltage V1.

Attenuator 302 is a second attenuator that attenuates voltage V2 that is a second voltage. In other words, attenuator 302 attenuates voltage V2 with a predetermined attenuation factor to output attenuated voltage V2.

For example, when the attenuation factor of attenuator 302 is set to a ratio of voltage V1 to a target voltage of voltage V2, the amplification factor of amplifier circuit 301 is 1. In other words, the amplification factor of amplifier circuit 301 and the attenuation factor of attenuator 302 are set in advance such that a product of voltage V1 and the amplification factor of amplifier circuit 301 is equal to a product of the target voltage of voltage V2 and the attenuation factor of attenuator 302.

Error extractor 303 is a second error extractor that extracts a difference between voltage V1 amplified by amplifier circuit 301 and voltage V2 attenuated by attenuator 302 as a differential signal. In other words, error extractor 303 outputs, as the differential signal, a difference between a voltage signal output from amplifier circuit 301 as a voltage and a voltage signal output from attenuator 302 as a voltage. That is, error extractor 303 outputs a fluctuation amount of voltage V2 with respect to voltage V1 as the differential signal.

Low-pass filter 304 outputs low-frequency components of the differential signal extracted by error extractor 108 to A/D converter 305. Low-pass filter 304 attenuates frequency components that are included in the differential signal and are not less than a Nyquist frequency of A/D converter 305 to, for example, −100 dB. As a result, the low-frequency components included in the differential signal are output to A/D converter 305. Removing the frequency components not less than the Nyquist frequency can reduce folding distortion caused by A/D converter 305.

Digital gain adjuster 306 increases or decreases a sound volume of a digital audio signal based on the differential signal extracted by error extractor 303. In other words, digital gain adjuster 306 adjusts a gain of the digital audio signal input to adder 101 to adjust the sound volume. This configuration can suppress a voltage signal from low-pass filter 104 to constant amplitude even when voltage V2 fluctuates. In other words, a gain of digital amplifier 300 can be kept constant regardless of a fluctuation of voltage V2.

Figure 13:
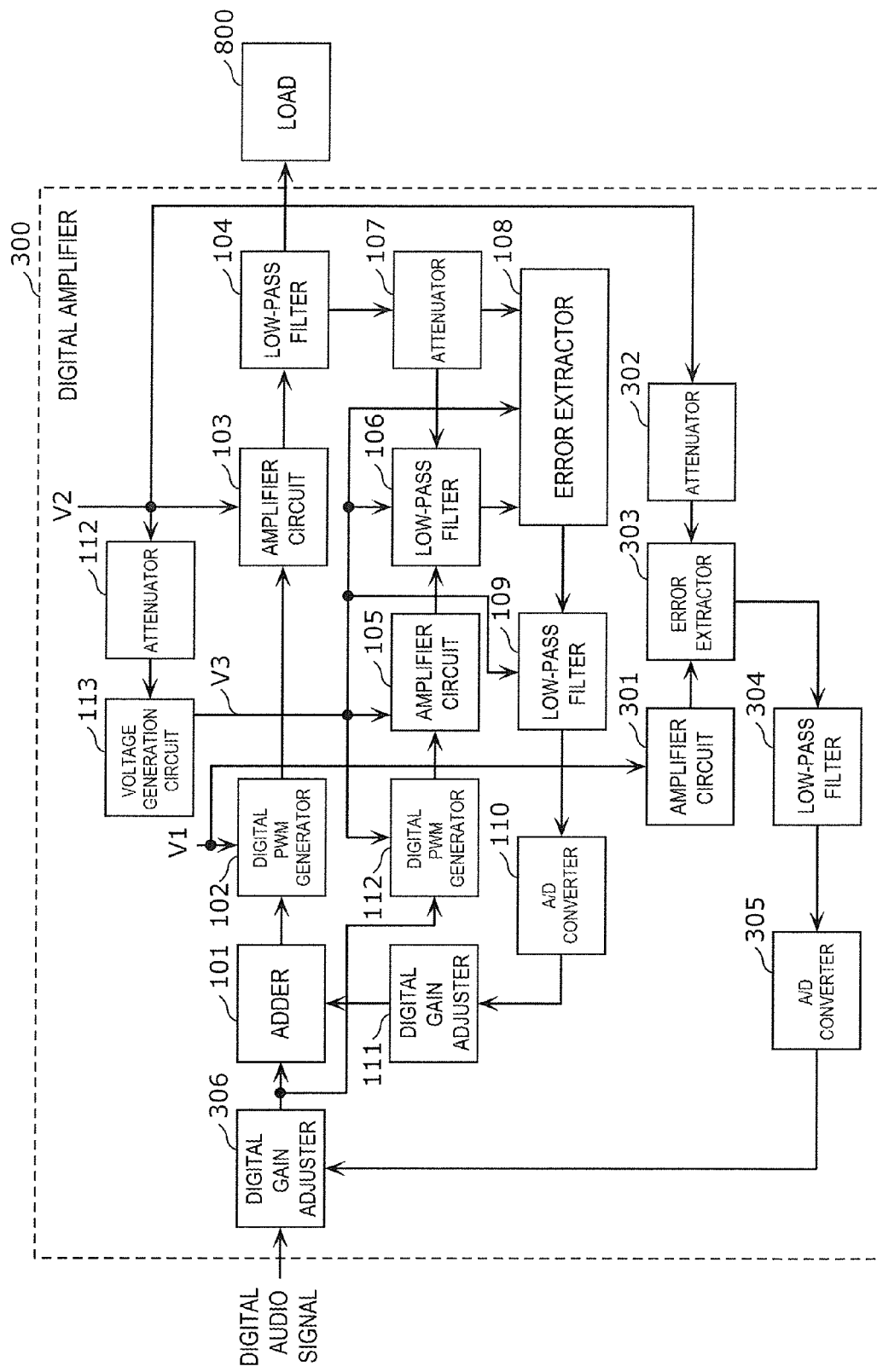
FIG. 13 is a diagram illustrating another configuration example of the digital amplifier according to the third exemplary embodiment.

FIG. 13 is a diagram illustrating another configuration example of digital amplifier 300 according to the third exemplary embodiment.

Digital amplifier 300 may further include digital PWM generator 114. Digital PWM generator 114 converts the digital audio signal into a digital PWM signal. Amplifier circuit 105 amplifies the digital PWM signal. Digital PWM generator 114 generates a signal for comparison that is used by error extractor 108. Then a digital error signal whose feedback gain is adjusted by digital gain adjuster 111 is added to the digital audio signal by adder 101. A digital PWM signal to which an inverse characteristic of the error signal has been applied beforehand is thus output to amplifier circuit 103.

In digital amplifier 300 thus configured according to the present exemplary embodiment, similar to the first exemplary embodiment, a ratio of voltage V3 supplied to amplifier circuit 105 to voltage V2 supplied to amplifier circuit 103 can be made constant, regardless of the fluctuation of voltage V2. Furthermore, as described above, a gain of digital amplifier 300 can be made constant regardless of the fluctuation of voltage V2.

Figure 14:
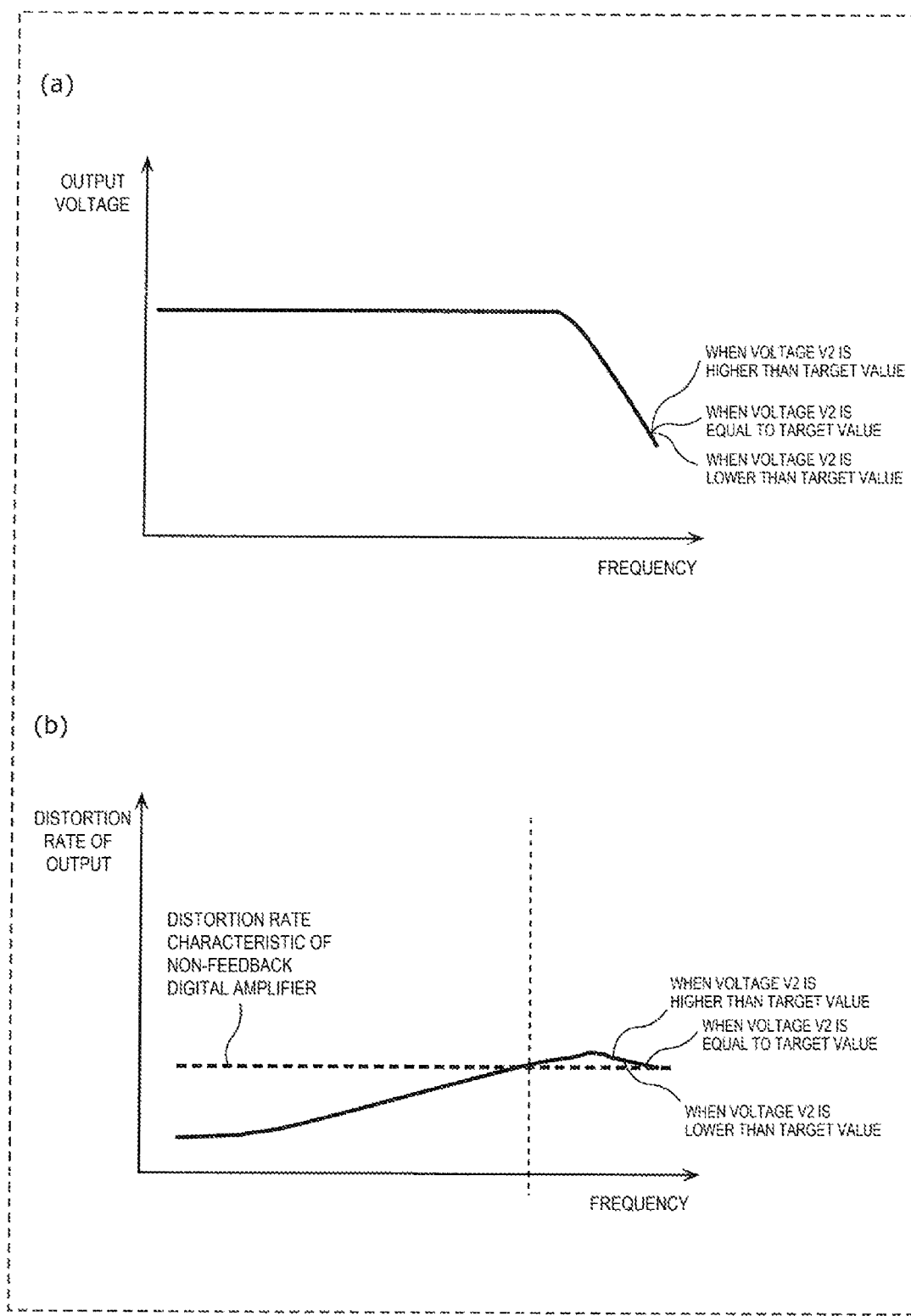
FIG. 14 is a graph illustrating frequency characteristics of the digital amplifier according to the third exemplary embodiment.

FIG. 14 is a graph illustrating frequency characteristics of digital amplifier 300 according to the present exemplary embodiment. More specifically, part (a) of FIG. 14 illustrates a relationship between an output voltage of digital amplifier 300 and a frequency, and part (b) of FIG. 14 illustrates a relationship between a distortion rate of an output of digital amplifier 300 and a frequency.

In digital amplifier 300 according to present exemplary embodiment, as illustrated in part (a) of FIG. 14, the frequency characteristics of the output voltage can be flattened in comparison with the example illustrated in part (a) of FIG. 5. In other words, the output voltage of digital amplifier 300 can be flattened, or be made constant over a wide frequency band. Furthermore, in the present exemplary embodiment, even when voltage V2 that is a second voltage fluctuates, the output voltage can be kept constant. In other words, a gain can be kept constant regardless of voltage V2. Accordingly, even when digital amplifier 300 mounted on a vehicle uses voltage V2 that can be obtained from a battery of the vehicle and includes a variation factor, digital amplifier 300 can amplify the digital PWM signal with a stable gain.

Further, as illustrated in part (b) of FIG. 14, the distortion rate of the output of digital amplifier 300 according to the present exemplary embodiment is suppressed smaller than a distortion rate of an output of non-feedback digital amplifier 900 up to a frequency limited by low-pass filter 106 and the like. Furthermore, the distortion rate of digital amplifier 300 can be made constant independently of voltage V2. As a result, it is possible to suppress voltage amplitude of the low-frequency components of the error signal applied to A/D converter 110 from exceeding an input range of A/D converter 110.

Herein, in digital amplifier 300, the signal passes through low-pass filters 104, 106, and 109 that are configured in multiple stages, and the analog signal is converted into the digital signal by A/D converter 110. Accordingly, the digital error signal that is a feedback signal whose feedback gain described above is adjusted includes delay elements. Therefore distortion of the output can be corrected within a range limited to a low frequency band. Further, in the present exemplary embodiment, attenuator 112 and voltage generation circuit 113 configure a gain compensation circuit that compensates the voltage amplitude of the digital PWM signal that serves as a reference and is output from amplifier circuit 105. As a result, a non-linear component that is distortion of an output generated in amplifier circuit 103 and low-pass filter 104 can be improved. Furthermore, digital gain adjuster 306 can always keep the output voltage of low-pass filter 104 so as to be constant amplitude and can flatten the output voltage for each frequency, even when voltage V2 that is a power supply voltage of amplifier circuit 103 fluctuates. Therefore, digital amplifier 300 according to the present exemplary embodiment can be mounted on a vehicle or consumer equipment in which voltage V2 is not stabilized.

The digital amplifier according to one or more aspects has been described above based on the exemplary embodiments. However, the present disclosure is not limited to the exemplary embodiments. Configurations in which various variations conceived by those skilled in the art are applied to the present exemplary embodiments, and configurations established by combining components in different exemplary embodiments may also fall within the scope of the present disclosure, without departing from the gist of the present disclosure.

The present disclosure is applicable to a digital amplifier that is, for example, an amplifier for consumer use or vehicle use, and is provided for outputting sound corresponding to a digital audio signal.

What is claimed is:

1. A digital amplifier comprising:
   a digital pulse width modulation (PWM) generator that generates a digital PWM signal corresponding to a digital audio signal by using a first voltage;
   a first amplifier circuit that amplifies the digital PWM signal at a second voltage whose absolute value is larger than an absolute value of the first voltage;
   a first low-pass filter that extracts low-frequency components, as a first analog voltage signal, from a first amplified digital PWM signal amplified by the first amplifier circuit, and outputs the low-frequency components to a load;
   a second amplifier circuit that amplifies the digital PWM signal at a third voltage whose absolute value is smaller than the absolute value of the second voltage;
   a second low-pass filter that extracts low-frequency components, as a second analog voltage signal, from a second amplified digital PWM signal amplified by the second amplifier circuit;
   a first attenuator that attenuates the first analog voltage signal extracted by the first low-pass filter to generate a first attenuated analog voltage signal;
   an error extractor that extracts an error signal based on the second analog voltage signal extracted by the second low-pass filter and the first attenuated analog voltage signal generated by the first attenuator;
   a digital error signal generator that generates, from the error signal, a digital error signal whose feedback gain is adjusted, the digital error signal being generated by digitizing the error signal;
   an adder that adds the digital error signal to the digital audio signal; and
   a voltage supply unit that generates the third voltage that has a voltage value of a predetermined ratio to a voltage value of the second voltage by using the second voltage, and supplies the third voltage to at least the second amplifier circuit.

2. The digital amplifier according to claim 1, wherein an amplification factor of the second amplifier circuit is equal to a product of an amplification factor of the first amplifier circuit and an attenuation factor of the first attenuator.

3. The digital amplifier according to claim 1, further comprising:
   a third amplifier circuit that amplifies the first voltage;
   a second attenuator that attenuates the second voltage;
   a second error extractor that extracts, as a differential signal, a difference between the first voltage amplified by the third amplifier circuit and the second voltage attenuated by the second attenuator; and
   a digital gain adjuster that increases or decreases a sound volume of the digital audio signal based on the differential signal extracted by the second error extractor.

4. The digital amplifier according to claim 3, wherein an amplification factor of the second amplifier circuit is equal to a product of an amplification factor of the first amplifier circuit and an attenuation factor of the first attenuator.

5. A digital amplifier comprising:
   a digital pulse width modulation (PWM) generator that generates a digital PWM signal corresponding to a digital audio signal by using a first voltage;
   a voltage generation circuit that generates a second voltage that has a voltage value of a predetermined ratio to a voltage value of the first voltage by using a third voltage, the second voltage having an absolute value that is larger than an absolute value of the first voltage;
   a first amplifier circuit that receives the second voltage and amplifies the digital PWM signal at the second voltage;
   a first low-pass filter that extracts low-frequency components, as a first analog voltage signal, from a first amplified digital PWM signal amplified by the first amplifier circuit, and outputs the low-frequency components to a load;
   a second amplifier circuit that amplifies the digital PWM signal at the first voltage;
   a second low-pass filter that extracts low-frequency components, as a second analog voltage signal, from a second amplified digital PWM signal amplified by the second amplifier circuit;
   an attenuator that attenuates the first analog voltage signal extracted by the first low-pass filter to generate a first attenuated analog voltage signal;
   an error extractor that extracts an error signal based on the second analog voltage signal extracted by the second low-pass filter and the first attenuated analog voltage signal generated by the attenuator;
   a digital error signal generator that generates, from the error signal, a digital error signal whose feedback gain is adjusted, the digital error signal being generated by digitizing the error signal; and
   an adder that adds the digital error signal to the digital audio signal.

6. The digital amplifier according to claim 5, wherein an amplification factor of the second amplifier circuit is equal to a product of an amplification factor of the first amplifier circuit and an attenuation factor of the attenuator.

* * * * *